United States Patent
Kats

Patent Number: 5,876,790
Date of Patent: Mar. 2, 1999

[54] VACUUM EVAPORATION METHOD FOR PRODUCING TEXTURED $C_{60}$ FILMS

[75] Inventor: Evgueni Kats, Sede Boker, Israel

[73] Assignee: Ormat Industries Ltd., Israel

[21] Appl. No.: 778,013

[22] Filed: Dec. 31, 1996

[51] Int. Cl.[6] .................................................. C23C 14/24
[52] U.S. Cl. ..................... 427/122; 427/249; 423/445 R; 423/DIG. 40
[58] Field of Search ................................. 427/122, 249; 505/460; 118/715; 423/445 R, DIG. 40

[56] References Cited

U.S. PATENT DOCUMENTS

| | | | |
|---|---|---|---|
| 5,374,463 | 12/1994 | Ueba et al. | |
| 5,380,595 | 1/1995 | Ueba et al. | 428/408 |
| 5,538,763 | 7/1996 | Ueba et al. | |
| 5,558,903 | 9/1996 | Bhushan et al. | 427/11 |
| 5,635,455 | 6/1997 | Okuda et al. | 505/460 |

OTHER PUBLICATIONS

Hebard et al, Thin Solid Films, 257 (1995) pp. 147–153.
Eklund et al, Thin Solid Films, 257 (1995), pp. 211–232.
Bunshah et al, "Deposition Technologies For Films And Coatings", 1982, Noyes Publications, pp. 113, 114 and 118.
C.A. Mirkin et al., Thin Film, Fullerne–Based Materials *Tetradhedron*, vol. 52 No. 14. pp. 5113–5130, 1996.
D. Faiman et al. Solar Cells from C60, *Proceedings* Optical materials for Energy Efficiency and Solar Energy Conversion XIV, vol. 2531 San Diego, California, Jul. 12–13, 1995, pp. 168–175.
A.F. Hebard et al., C60 films on Surface–Treated Silicon; Recipes for Amorphous and Crystalline Growth *Thin Solid Films* vol. 257, 1995, pp. 147–153.
D. Stifter et al., Thickness correlated effects on the crystal and surface structure of C60 thin films grown on mica by hot wall epitaxy *Thin Solid Films* vol. 280. 1996, pp. 83–85.
J.H. Weaver et al., Solid state properties of Fullerenes and Fullerene–based materials *Solid State Physics* vol. 48, 1994, pp. 1–35.

*Primary Examiner*—Roy V. King

[57] ABSTRACT

According to the present invention, a method and apparatus are provided for growing $C_{60}$ thin film or films having a high degree of textured crystallinity using vacuum evaporation with a high deposition rate onto the substrate maintained at substantially high temperature. The method includes producing a thin film of $C_{60}$ with high degree of textured crystallinity on the substrate using a vacuum evaporation system having the steps of using a metal substrate; operating the substrate at a high temperature of during the growth or deposition period; and ensuring that the deposition rate of $C_{60}$ onto the substrate be high.

7 Claims, 3 Drawing Sheets

↓ TO DIFFUSION VACUUM PUMP

TO DIFFUSION VACUUM PUMP

VACUUM EVAPORATION METHOD FOR PRODUCING TEXTURED $C_{60}$ FILMS

DESCRIPTION

1. Technical Field

This invention relates to a method of and apparatus for producing thin films of fullerenes, and more particularly to a method of and apparatus for producing thin films of $C_{60}$.

2. Background of the Invention

Vacuum evaporation for $C_{60}$ thin film growth onto a substrate at the temperature upto 200° C. has been previously used, see eg. U.S. Pat. No. 5,538,763. Furthermore, in accordance with the invention disclosed in this U.S. patent, low deposition rates are provided. Low deposition rates have also been reported by others as well, see eg. Thin Solid Films, 257 (1995), 147 and Thin Solid Films, 280(1996) 83. However, under such conditions, textured $C_{60}$ thin films cannot be produced.

Various uses have been proposed for thin layers of $C_{60}$, see eg. U.S. Pat. No. 5,374,463 which discloses the usefulness of a layer of $C_{60}$ for magnetic disc.

In addition, molecular beam epitaxy can be used for growing thin films of $C_{60}$ with textured crystallinity. See also eg. U.S. Pat. No. 5,538,763. However, such methods are very costly and very complicated and provide very low deposition rates, see e.g. Weaver, j. and D. M. Poirier, Solid State Physics 48, (edited by Ehernreich H. and Spaepen, F. 1994) 1.

In addition, other methods such as clusterion beam method, sputtering, a Lagmuir-Blodget's film method and solvent coating can be used. All such methods are costly, complicated to use and provide low deposition rates.

It is therefore an object of the present invention to provide a new and improved method of and means for producing thin films of $C_{60}$ which substantially overcome or significantly reduce the disadvantages outlined above.

Brief Description of the Invention

In accordance with the present invention, a method is provided for growing $C_{60}$ thin film (or films) having a high degree of textured crystallinity using vacuum evaporation with a high deposition rate onto the substrate maintained at substantially high temperature. The method comprises a method for producing a thin film of $C_{60}$ with high degree of textured crystallinity on the substrate using a vacuum evaporation system comprising the steps of using a substrate comprising a metal; operating the substrate at a temperature of between approximately 200° to 300° C. and preferably 250° to 300° C. during the growth or deposition period; and ensuring that the deposition rate of $C_{60}$ onto the substrate be higher than 10 angstroms per second and preferably between approximately 10 and 20 angstroms per second. Preferably, the substrate is a silver (Ag) or gold (Au) coated glass substrate, or a silver (Ag) or gold (Au) substrate, or a silver (Ag) or gold (Au) coated other material substrate.

Moreover, the present invention comprises providing apparatus for carrying the above mentioned method steps of the present invention. Such apparatus can include: apparatus for producing a thin film of $C_{60}$ with high degree of textured crystallinity on the substrate comprising: a vacuum evaporation system comprising a metal substrate operating at a temperature of between approximately 200° to 300° C. and preferably 250° to 300° C. during the growth or deposition period; and means for ensuring that the deposition rate of $C_{60}$ onto the substrate be higher than 10 angstroms per second and preferably between approximately 10 and 20 angstroms per second. Preferably, the substrate is a silver (Ag) or gold (Au) coated glass substrate, or a silver (Ag) or gold (Au) substrate, or a silver (Ag) or gold (Au) coated other material substrate.

BRIEF DESCRIPTION OF THE DRAWINGS

Embodiments of the present invention are described by way of the example with reference to the accompanying drawings wherein.

DETAILED DESCRIPTION

Figure 1:
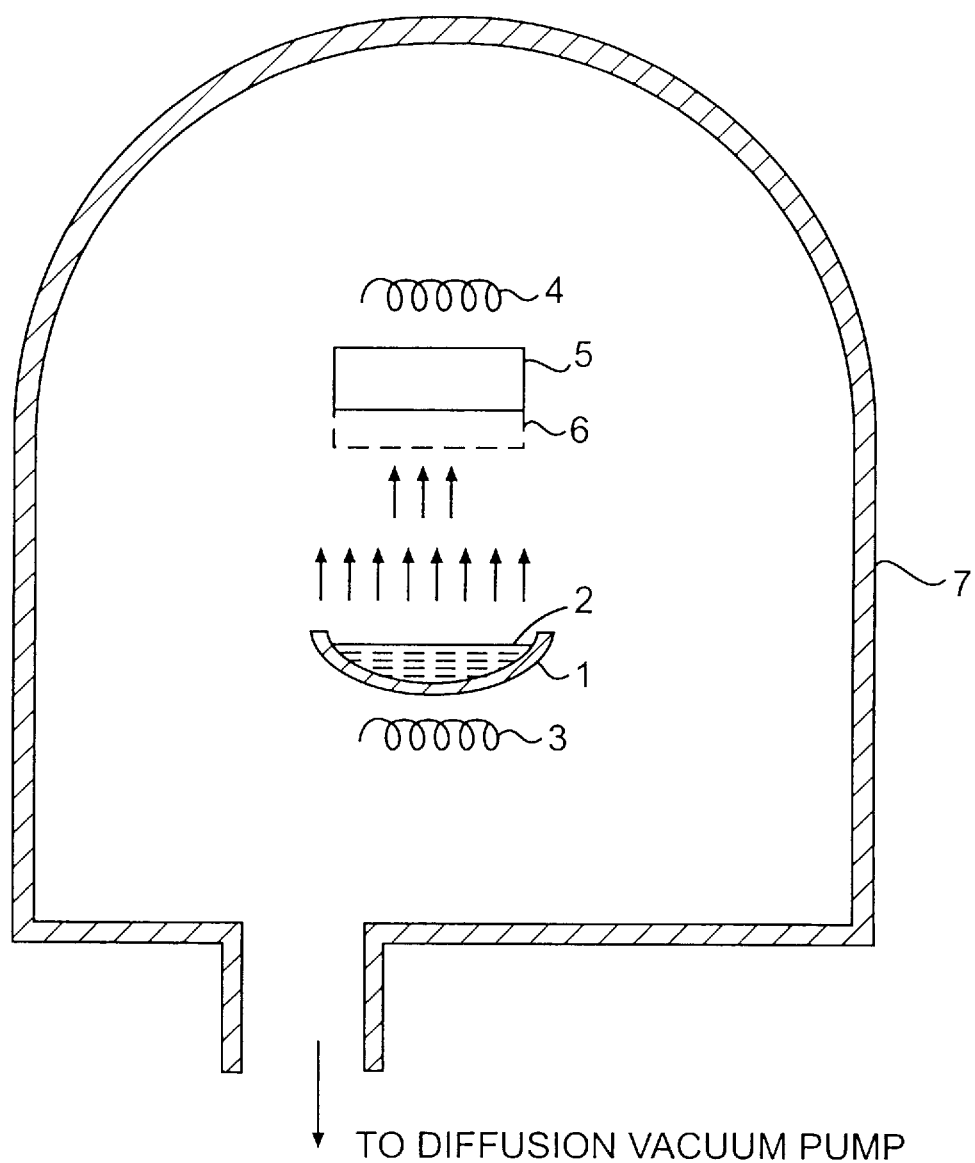
FIG. 1 is a block diagram which represents, in a schematic way, an embodiment of the present invention.

Referring now to FIG. 1, reference numeral 10 designates apparatus for producing thin films of $C_{60}$ in accordance with the present invention.

Figure 2:
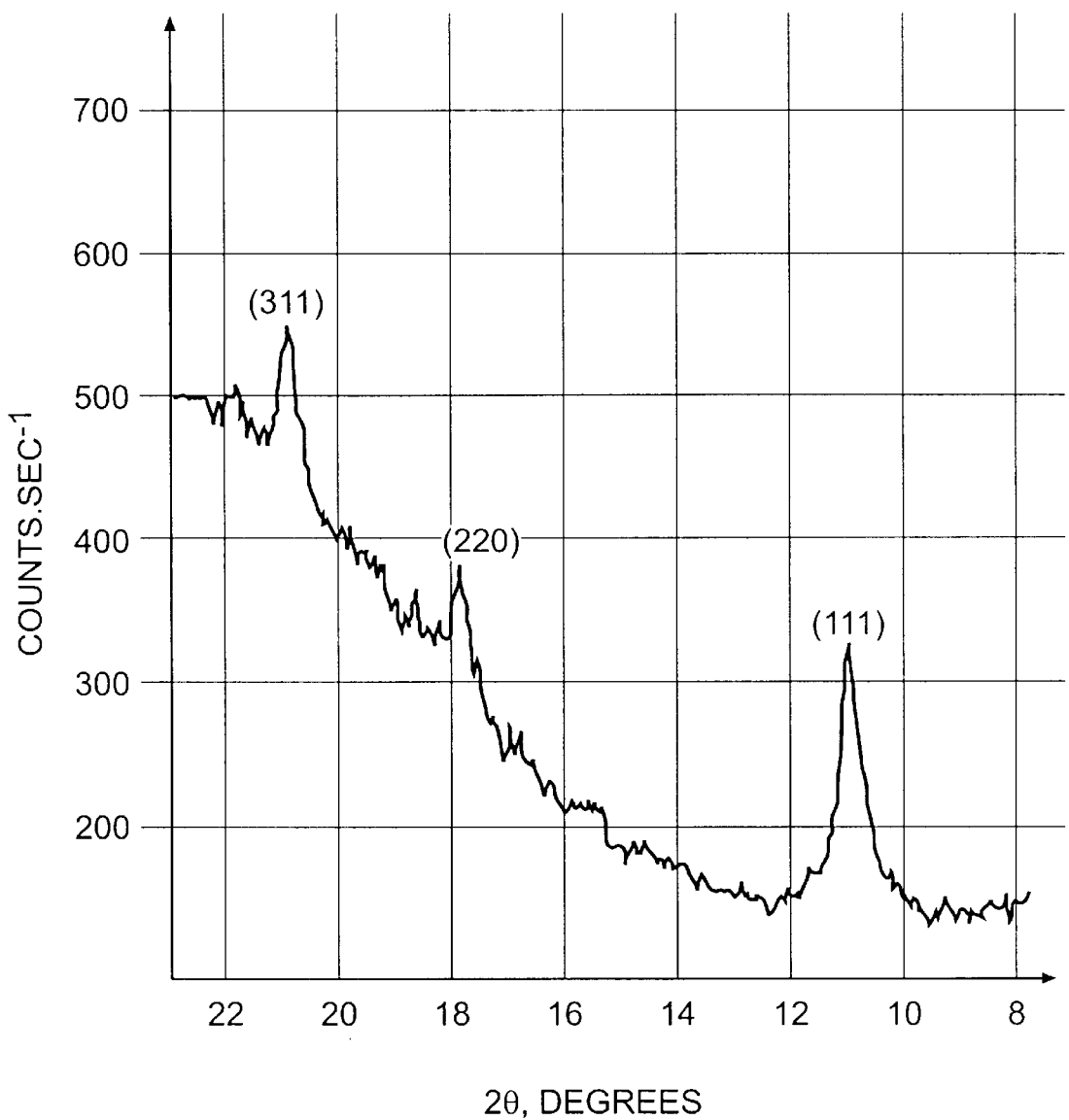
FIG. 2 is an x-ray diffraction pattern of thin films of $C_{60}$ produced in accordance with the prior art.

FIG. 1 shows in a schematic way apparatus used in accordance with the present invention. When operating such apparatus, $C_{60}$ thin films were evaporated, using a vacuum deposition technique at a pressure in chamber or vacuum furnace designated 7 in FIG. 1 of $7*10^{-7}$ torr. The starting powder which was commercially obtained $C_{60}$ (99.98% pure) purchased from Hoechst AG, was placed in crucible 1 and crucible heating element 3 was used for evaporating the $C_{60}$ present in crucible 3. Thin films designated as 6 in FIG. 1 were obtained by depositing the evaporated $C_{60}$ onto substrate 5 maintained at a certain temperature by use of substrate heating element 4. The thickness of the $C_{60}$ films was monitored "in situ" by a quartz oscillator and then checked by interference microscope. X-ray diffraction patterns were measured at the same conditions for all samples to characterize structure of $C_{60}$ films. Usually, it is impossible to grow $C_{60}$ films with textured crystallinity using this simple technique. Eg., FIG. 2 displays a typical x-ray diffraction pattern of a $C_{60}$ thin film deposited at a rate of 0.2–0.4 angstroms/sec onto the glass substrate held at 170° C. (see proc. SPIE, 2531 (1995) 168). This film had face cubic centered (fcc) crystalline structure but it is not textured, ie. the intensities of the Bragg peaks (111), (220) and (311) are approximately the same.

Figure 3:
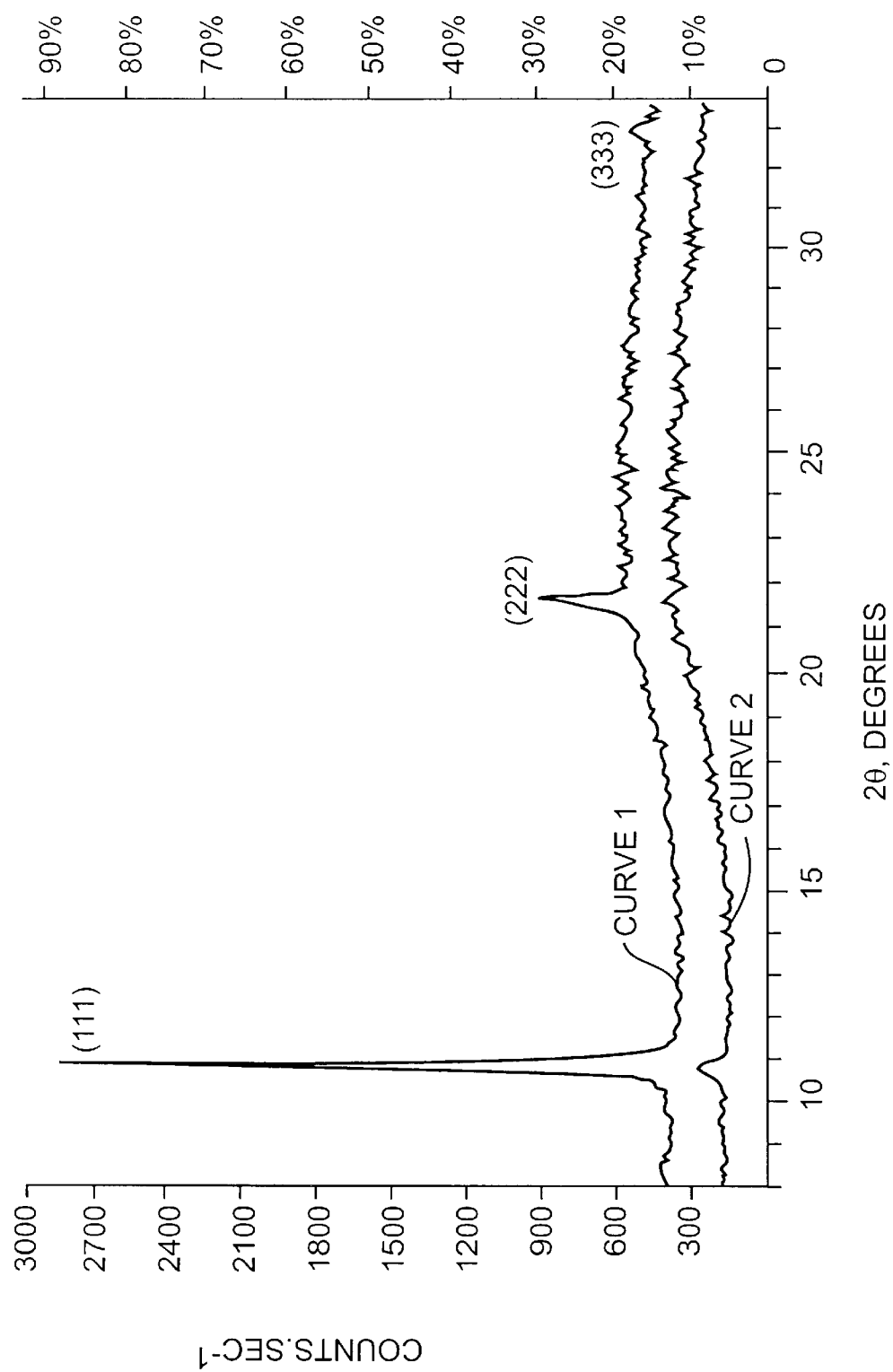
FIG. 3 is an x-ray diffraction pattern of thin films of $C_{60}$ produced in accordance with the present invention.

In accordance with the present invention, optical glass substrate predeposited with a silver (Ag) layer was held at 250°–300° C. during the deposition period, the preferred temperature range in accordance with the present invention. Furthermore, the geometry of a vacuum deposition system as well as parameters of powder evaporation let us achieve a deposition rate of between 10–20 angstroms/sec, the preferred range of deposition rate in accordance with the present invention, FIG. 3 displays the x-ray diffraction pattern of the $C_{60}$ film obtained having a thickness of 1000 angstroms evaporated under these conditions onto the Ag (curve 1) and glass (curve 2) part of the same substrate, Peaks (220) and (311) are absent from the x-ray pattern of the $C_{60}$ film evaporated onto the Ag surface. One can see only a very narrow and intensive peak (111) as well as its higher harmonics (222) and (333). In other words, this $C_{60}$ film has a strong (111) texture, i.e. a well-aligned growth of the $C_{60}$ molecules with the (111) planes parallel to the substrate surface takes place under these conditions. This texture remains for the film grown on Ag substrate at the temperatures down to 200° C., however, the intensity of (111) peak for such a film was only about 1400 counts sec$^{-1}$. This is considerably lower than the values of 2500–4600 counts sec$^{-1}$ for the films with the same thickness grown on the substrate held at between 250°–300° C.

The sizes of crystalline domains for textured $C_{60}$ films are sufficiently high. We have estimated the coherence length along the out-of-plane <111> direction from the full-width-at-half-maximum of the (111) peak using the Scherrer formula. It is in the range of 315–630 angstroms for different samples with the maximum value for the film deposited onto the substrate at 300° C.

It should be stressed that the well-ordered $C_{60}$ thin films (strong 111-texture, the coherence length upto 630 angstroms) were grown in accordance with the present invention on the Ag (Au) substrates held at 250°–300° C. with extremely high depostion rate (10–20 angstroms.sec$^{-1}$). Conventionally, the deposition rate for well-ordered $C_{60}$ thin films does not exceed 0.01–0.5 angstroms.sec$^{-1}$. Furthermore, this process conventionally requires complicated and expensive ultrahigh vacuum system like that used in molecular beam epitaxy.

In accordance with the present invention, the substrate shown as numeral 5 in FIG. 1 preferably is a silver or gold coated glass substrate, or a silver or gold substrate, or a silver or gold coated other material substrate. Furthermore, a copper substrate, a copper coated glass substrate and a copper coated other material substrate can be used as the substrate according to the present invention. In addition, another metal substrate, another metal coated substrate and another metal coated other material substrate can also be used as the substrate according to the present invention. Moreover, a silicon substrate or other semiconductor or insulator substrate can be used as the substrate in accordance with the present invention.

Industrial uses for $C_{60}$ thin films produced in accordance with the present invention as shown in FIG. 1 include an active layer or layers of electronic devices eg. transistors, photo-voltaic cells, solar cells including those used in building integrated photo-voltaic systems, integrated circuits, sensors, light emission devices, devices for electrophotography, magnetic recording discs, superconductors, and other devices.

Other applications of this invention include the production of $C_{60}$ thin films for selling to scientific groups.

The advantages and improved results furnished by the method and apparatus of the present invention are apparent from the foregoing description of the preferred embodiment of the invention. Various changes and modifications may be made without departing from the spirit and scope of the invention as described in the appended claims.

What is claimed is:

1. A method for producing, on a substrate, a thin film of $C_{60}$ having textured crystallinity using a vacuum evaporation system comprising the steps of:

a. using a substrate comprising a metal;

b. operating the substrate at a temperature of between approximately 200° to 300° C.; and c. ensuring that the deposition rate of $C_{60}$ on the substrate be higher than 10 angstroms per second.

2. A method according to claim 1 wherein the step of using a substrate comprising a metal includes using a silver or gold coated glass substrate.

3. A method according to claim 1 wherein the step of using a substrate comprising a metal includes using a silver or gold substrate.

4. A method according to claim 1 wherein the step of using a substrate comprising a metal includes using a silver or gold coated substrate.

5. A method according to claim 1 wherein the step of operating the substrate at a temperature of between approximately 200° to 300° C. is carried out by operating the substrate at a temperature between 250° to 300° C. during the deposition period.

6. A method according to claim 1 wherein the step of ensuring that the deposition rate of $C_{60}$ onto the substrate be higher than 10 angstroms per second is carried out by ensuring that the deposition rate of $C_{60}$ onto the substrate be between approximately 10 and 20 angstroms per second.

7. A method for producing, on a substrate, a thin film of $C_{60}$ having textured crystallinity using a vacuum evaporation system comprising the steps of:

a. using a substrate comprising a semi-conductor:

b. operating the substrate at a temperature of between approximately 200° to 300° C.; and c. ensuring that the deposition rate of $C_{60}$ on the substrate be higher than 10 angstroms per second.

* * * * *